United States Patent [19]
Lusignea et al.

[11] Patent Number: 4,966,806
[45] Date of Patent: Oct. 30, 1990

[54] FILM-BASED STRUCTURAL COMPONENTS WITH CONTROLLED COEFFICIENT OF THERMAL EXPANSION

[75] Inventors: Richard W. Lusignea, Brighton; William S. Stevenson, Concord; John F. McCoy, III, N. Chelmsford, all of Mass.

[73] Assignee: Foster Miller, Inc., Waltham, Mass.

[21] Appl. No.: 206,620

[22] Filed: Jun. 14, 1988

Related U.S. Application Data

[63] Continuation-in-part of Ser. No. 942,150, Dec. 16, 1986, Pat. No. 4,871,595.

[51] Int. Cl.$^5$ .............................................. B23B 9/00
[52] U.S. Cl. ................... 428/220; 428/334; 428/335; 428/1
[58] Field of Search .................. 428/1, 220, 334, 335

[56] References Cited

U.S. PATENT DOCUMENTS

| | | | |
|---|---|---|---|
| 3,595,736 | 7/1971 | Buteux | 428/910 |
| 3,598,637 | 8/1971 | Stoll et al. | 428/910 |
| 3,681,297 | 8/1972 | D'Alelio | 548/152 |
| 4,041,206 | 8/1977 | Tsunashima et al. | 428/910 |
| 4,332,759 | 6/1982 | Ide | 264/108 |
| 4,333,907 | 6/1982 | Urasaki et al. | |
| 4,353,974 | 10/1982 | Yamaoka et al. | 174/68.5 |
| 4,370,293 | 1/1983 | Peterson-Hoj | 264/514 |
| 4,487,735 | 12/1984 | Chenevey et al. | 264/85 |
| 4,547,416 | 10/1985 | Reed et al. | |
| 4,554,119 | 11/1985 | Chenevey | 264/85 |
| 4,569,885 | 2/1986 | Yamaguchi et al. | 428/910 |
| 4,614,629 | 9/1986 | Economy et al. | |
| 4,668,448 | 5/1987 | Weber et al. | 264/22 |
| 4,699,821 | 10/1987 | Hallock | |
| 4,721,637 | 1/1988 | Suzuki et al. | |
| 4,772,089 | 9/1988 | Ide et al. | 350/96.23 |
| 4,778,244 | 10/1988 | Ryan | 350/96.23 |
| 4,786,348 | 11/1988 | Luise | |
| 4,796,982 | 1/1989 | Kitabatake et al. | 350/356 |

FOREIGN PATENT DOCUMENTS 51-16363 2/1976 Japan .................................... 264/559

OTHER PUBLICATIONS

F. Dance, Electronic Production, 42–48 (1982).
Amick et al., Thermal Analyses of Chip Carrier Compatible Substrates, McDonnell Douglas Elec. Co., 34–39.
C. Guiles, SAMPE Journal, 77–80 (1985).
D. Packard, SAMPE Journal, 6–14 (1984).
B. Rodini, Air Force Contract Review Report, Apr., 1986.
L. Zakraysek, Air Force Contract Review Report, General Electric, Aug., 1985.
Pillar and Lorraine, Air Force Contract Review Report, Apr., 1986.
R. Belke, Jr., Air Force Contract Review Report, Apr., 1986.

*Primary Examiner*—Patrick Ryan
*Attorney, Agent, or Firm*—David G. Conlin; Ernest V. Linek; Linda M. Buckley

[57] ABSTRACT

This invention relates in general to the preparation of near zero CTE (coefficient of thermal expansion) film-based structural components from aromatic heterocyclic, molecularly oriented, or lyotropic liquid crystalline, polymers, and to the use of such near-zero CTE film based structural components for the preparation of space-based structural members, especially film-based components used in the construction of satellites, space craft, space stations, space-based mirrors, e.g., for the Strategic Defense Initiative, and the like.

14 Claims, 1 Drawing Sheet

BALANCED BIAXIAL (θ = +/− 43 deg) PBT FILM THERMAL EXPANSION. NOTE: CURVES SHOULD INTERSECT AT 0 DEFLECTION AT ROOM TEMPERATURE. THEY HAVE BEEN SEPARATED IN THIS PLOT FOR CLARITY

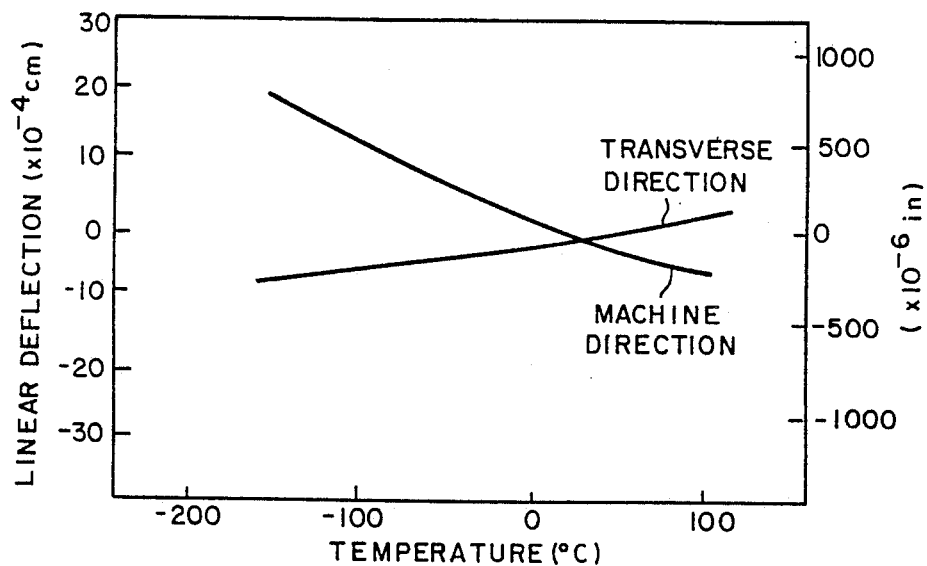
FIG.1 HIGH DRAW (θ = +/-11 deg) PBT FILM THERMAL EXPANSION
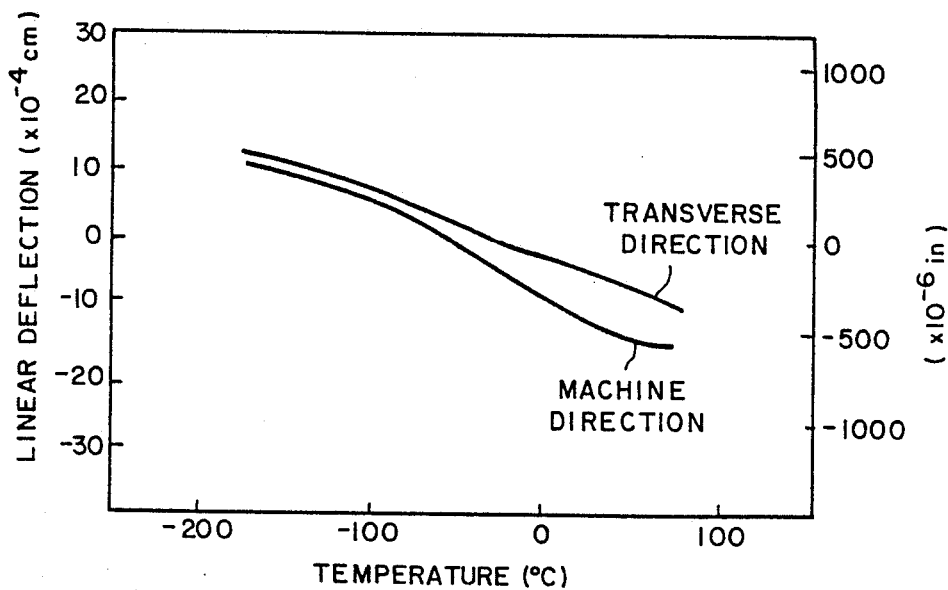
FIG.2 BALANCED BIAXIAL (θ = +/- 43 deg) PBT FILM THERMAL EXPANSION. NOTE: CURVES SHOULD INTERSECT AT 0 DEFLECTION AT ROOM TEMPERATURE. THEY HAVE BEEN SEPARATED IN THIS PLOT FOR CLARITY

FILM-BASED STRUCTURAL COMPONENTS WITH CONTROLLED COEFFICIENT OF THERMAL EXPANSION

STATEMENT OF GOVERNMENT INTEREST

Funding for the present invention was obtained from the Government of the United States by virtue of Contract No. F33615-85-C-5009 from the Department of the Air Force. Thus, the Government of the United States has certain rights in and to the invention claimed herein.

CROSS-REFERENCE TO RELATED APPLICATIONS

The present application is a continuation-in-part of the copending application of Richard W. Lusignea and William S. Stevenson, Serial No. 942,150, filed 16 Dec. 1986, U.S. Pat. No. 4,871,595 The disclosure of this application, to the extent necessary, is hereby incorporated herein by reference.

FIELD OF THE INVENTION

This invention relates in general to the preparation of controlled, especially near zero, CTE (coefficient of thermal expansion) film-based structural components from molecularly oriented lyotropic liquid crystalline polymers, and particularly to the use of these near-zero CTE film based structural components for the preparation of space-based structural members, especially film-based components used in the construction of satellites, space craft, space stations, space-based mirrors, e.g., for the Strategic Defense Initiative, and the like.

BACKGROUND OF THE INVENTION

Conventional structural components cannot meet the strength demands of outer space without severe weight penalties, high cost, and/or slow fabrication. On the other hand, near zero CTE film based structural components, especially composite structures made from self-reinforcing multiaxially molecular oriented lyotropic liquid crystalline polymers and secondary reinforcing materials, demonstrate excellent intrinsic and tailorable properties which fulfill all of the strength and weight requirements envisioned for space based materials.

The multiaxially oriented film-based materials used in the construction of space based components are preferably prepared from rod-like extended-chain, aromatic—heterocyclic polymers, which are also referred to as lyotropic liquid crystalline polymers, and which are also referred to by the shorthand expression "ordered polymers." See for example, U.S. Pat. Nos. 4,533,692, 4,533,693, 4,533,724 to Wolfe et al., U.S. Pat. Nos. 4,051,108, 4,207,407, and 4,377,546 to Helminiak et al., U.S. Pat. Nos. 4,323,493 and 4,321,357 to Keske et al., U.S. Pat. No. 4,229,566 to Evers et al., U.S. Pat. No. 4,108,835 to Arnold et al., and U.S. Pat. No. 4,423,202 to Choe. The disclosures of these patents, to the extent necessary, are hereby incorporated herein by reference.

Molecularly oriented lyotropic liquid crystalline polymers have been under development for over ten years. Impressive successes have been realized in the synthesis of these rigid rod-like polymers, whose strong stiff molecules can be processed into extremely high strength, high modulus fibers.

One especially preferred molecularly oriented liquid crystalline polymer of this type is poly para-phenylenebisbenzothiazole or PBzT. The processing of PBzT into fibers has been of special interest to many investigators, and is currently under development for large quantity production.

On the other hand, the processing of ordered polymers such as PBzT into non-fiber components is still in its infancy. Most current investigative work is directed at attaining only film type materials.

SUMMARY OF THE INVENTION

The present invention is based upon the discovery that ordered polymers, such as PBzT, can be readily formed into near zero CTE film based structural components which retain a multiaxial orientation imparted thereto during processing, and that these rigid, high-stiffness film based components can exhibit near zero coefficient of thermal expansion (CTE). Zero CTE materials are not adversely affected by vast swings in temperature, e.g., from very hot to very cold in short periods of time, nor are they adversely affected by long term exposure to either temperature extreme. The near zero CTE film based components of the present invention thus represent a revolutionary advance in space based hardware, as the extreme temperatures experienced there will not affect the rigidity of structures containing these components.

Another advantage of ordered polymer near zero CTE film based structures are their specific stiffness, which is calculated by dividing the modulus value for the material by its density value. This feature is important because thin-walled near zero CTE film based components will be limited by the stress required to cause local (or shell) buckling (this will be at a much lower stress than the material's compressive strength), and this stress is directly related to the modulus.

It is known that high modulus, low density materials are required for space structures. Metals fall into the range of specific stiffness of $1.1 \times 10^8$ in. or less. Quasi-isotropic graphite fiber-reinforced composite materials have specific stiffness up to $2 \times 10^8$ in., but are limited by thickness.

PBzT film-based materials have the capability to exceed $2 \times 10^8$ in. specific modulus as a very thin quasi-isotropic material. This allows the formation of thin, dimensionally stable, high stiffness near zero CTE film based components, and sandwich-type composites.

In one preferred embodiment, PBzT film has been fabricated into a very thin-walled tube (0.005 in. wall thickness) which can be used as a compression strut in space-based applications. Local buckling loads could be further raised by slightly pressurizing the tube with a gas or liquid. A comparable strut made with conventional graphite/epoxy composites would weigh about four times as much.

Ordered polymers, such as PBzT, are electrically and thermally poor conductors, although these properties may be altered by modification of their base chemical composition. Conductivity can also be achieved by thin coatings, fillers or laminates. The compressive strength of PBzT fibers is known to be relatively low, but this may be of minor concern in space structures where compressive loads are limited by elastic stability before compressive yield stress is reached.

The present invention is thus directed to innovative, near zero CTE film based structural members prepared from lyotropic liquid crystalline polymers, especially well suited for space based applications, having the following properties:

(a) very thin gauge, e.g., from about 0.001 to 0.050 in.
(b) very high specific stiffness, e.g., over about $1\times10^8$ in., preferably $>2\times10^8$.
(c) tailorable properties including, but not limited to; strength, stiffness, toughness, and thermal conductivity.
(d) near zero coefficient of thermal expansion, e.g., less than $10^{-6}$ °C$^{-1}$, which is also tailorable.
(e) high impact resistance and fracture toughness, even at cryogenic temperatures.
(f) low temperature capability, e.g., to less than about 20° K., e.g., for liquid hydrogen space craft fuels.
(g) may be coated for hardness and survivability, or to alter thermal and electrical conductivity.

BRIEF DESCRIPTION OF THE DRAWINGS

FIG. 1 is a typical output from a quartz tube dilatometer showing the change in specimen length with temperature for +/−11 deg. PBzT film.

FIG. 2 is an output for +/−43 deg. film showing nearly equal slopes in both the MD and TD and, therefore, isotropic CTE.

DETAILED DESCRIPTION OF THE PREFERRED EMBODIMENTS

As set forth above, the present invention is based upon the discovery that ordered polymers, such as PBzT, can be readily formed into near zero CTE film based structures which retain a multiaxial orientation imparted thereto during processing, and that these rigid, high-stiffness near zero CTE film based components can exhibit near zero coefficient of thermal expansion (CTE).

More particularly, the present invention is directed to the use of PBzT for the formation of film based structural components having a near-zero coefficient of thermal expansion (CTE).

PBzT is the most technically advanced ordered polymer currently available. However, similar ordered polymers with superior properties, e.g., PBzO, PBzX, and the like, may be likewise be included within the fabrication and processing techniques developed for PBzT, and thus also formed into near zero CTE film based structural components having the necessary properties for space based applications.

The rod-like molecular structure of PBzT and its related family of ordered polymers, yields a "self-reinforced" material which achieves the properties of advanced fiber reinforced composites, but without the drawbacks of distinct fiber and matrix components. These well-known drawbacks include microcracking which occurs between the fiber and the matrix; mismatching of properties between the components, thickness, constraints, and the like. Proper orientation of the molecules during processing affords a structural component having a near-zero thermal expansion by counteracting the negative CTE in the longitudinal direction by the positive CTE in the transverse direction.

Table I illustrates the CTE properties of PBzT based films.

TABLE I

| | Coefficient of Thermal Expansion, ppm/°C. | |
|---|---|---|
| Film Orientation | alpha$^{11}$ (machine direction) | alpha$^{22}$ (transverse direction) |
| Uniaxial tape | −15 | +30 |
| Biaxial film, primary orientation at ±110 deg. | −14 | +4 |
| Biaxial film, primary orientation at ±100 deg. | −10 | −8 |
| Biaxial film, primary orientation at ±43 deg. | −7 | −5 |

MEASURED CTE OF PBzT FILM

Similar behavior has been observed for graphite fiber reinforced composites, where the negative CTE of the graphite counteracts the positive CTE of the matrix but these materials suffer from the drawbacks outlined above.

In preferred embodiments of the present invention, PBzT dope (PBzT and polyphosphoric acid) is fed to a counter rotating die to make a pre-oriented "green sheet." This "green sheet" can then be further processed by molding, stretching, and the like, to form desired film—based structural components. The output of the counter rotating die is a controllable CTE tube, which can then be further treated, e.g., with impregnants, and the like, to modify its properties.

The preferred counter rotating die system for use herein is described in detail in Harvey et al., U.S. Application Ser. No. 098,710, filed 21Sept. 1987, the disclosure of which, to the extent necessary, is hereby incorporated herein, by reference.

A secondary processing method of the present invention involves the use of a compression mold having two flat plates which can be raised and lowered as well as rotated to provide two directions of flow and shearing. A mold of this type is described in U.S. Pat. No. 4,614,629 to Economy et al. The biaxially oriented PBzT film produced by this process can then be further processed, if desired, into near zero CTE film based structural members.

In yet another processing method of the present invention, a biaxial stretching frame can be employed to produce a carefully controlled stretch in a pre-conditioned sheet of PBzT ordered polymer.

For example, a square piece of uncoagulated polymer solution is first extruded using the counter-rotating die. In preferred embodiments, this die extrudes a tube 1.5 in. in diameter by 5 in. long. The tube is slit longitudinally and then placed in the biaxial stretch frame. Elongation ratios from 2:1 to 5:1 have been applied to the extrudate to produce varying degrees of molecular orientation.

CTE measurements have been run made using a Perkin-Elmer TMS-2 thermo-mechanical analyzer. Results show that biaxially oriented ordered components of PBzT film have a slightly negative CTE, and that the magnitude of the thermal behavior depends upon direction of orientation relative to the test direction.

Compression molded specimens were tested in both the radial direction and the tangential direction. Specimens were mounted between split copper pins and cycled from −170° C. to 100° C., at 5° C./min. The temperature range was selected to simulate the operational temperatures of outer space.

Modifications were made to the Perkin-Elmer TMS-2 system to increase its accuracy and performance. The system was mounted on damping pads to isolate all vibrational motion. Heat tape was applied to the stand to prevent icing of the area surrounding the linear variable differential transformer which is susceptible to temperature changes.

System accuracy using the penetration probe was checked with National Bureau of Standards (NBS) specimens including silica, tungsten and copper. All calibration trials resulted in less than 5 percent error. These calibrations did not use the film holder grips which were used for PBzT film samples. Further results from the calibration tests were not used as correction factors on PBzT tests. Additional reliability trials were necessary when using the film sample probe. Since NBS does not provide calibration standards in film form, pure aluminum wire was obtained from Perkin Elmer and used to check system error with the film probe.

Simplified modeling techniques, based on composite plate theory have shown that two axis, i.e., biaxial orientation, can result in zero CTE along only one axis. However, the +/−45 deg. biaxial film prepared herein was found to be isotropically negative with CTE values of −3 to −5 ppm/°C.

High draw, nearly uniaxial film also showed potential for laminations to yield low CTE values. The following discussion will compare the relationships between CTE and angle ply molecular orientation angle.

PBzT film produced using the preferred counter rotating die could be made with primary molecular orientations of from +/−3 deg. to +/−45 deg. The CTE of such ordered components showed strong orientation dependence. High draw ordered components (+/−3 deg.) were strongly negative in the machine direction, with high positive CTE values in the transverse direction.

FIG. 1 is a typical output from the quartz tube dilatometer showing the change in specimen length with temperature for +/−11 deg. film. The machine direction CTE has a value of −14 ppm/°C., while the CTE in the transverse direction is +4 ppm/°C. Transverse direction tests show some hysteresis with thermal cycling. As the orientation angle is increased with respect to the machine direction (MD) the transverse direction (TD) CTE falls rapidly to negative values due to the overriding effect of the MD high modulus. These ordered components approach −7 ppm/°C. at 45 deg., where MD equals TD.

FIG. 2 is an output for +/−43 deg. film showing nearly equal slopes in both the MD and TD and, therefore, isotropic CTE.

The compression molded PBzT ordered films exhibited a variety of thermal expansion behaviors due to the morphological differences between specimens. The differences were primarily due to orientation processing procedures. Radial flow of the viscous polymeric solutions upon compression resulted in radial orientation. Subsequent rotation of the plates resulted in orientation of the polymer molecules in the rotation (tangential) direction. Isotropic positive CTE film was produced by combining radial flow and rotation.

The present invention will be further illustrated by the following examples, which are intended merely to assist the reader in understanding the present invention, and are not to be construed as limitations thereof.

EXAMPLE 1

In preferred embodiments, the PBzT/PPA dope is extruded through the preferred counter rotating tube die, forming a cylinder of uncoagulated PBzT, biaxially oriented by shearing between the two surfaces of the die. The PBzT film is maintained in an uncoagulated state by keeping it free from moisture until it is placed in a biaxial stretching frame. The stretching frame is used to stretch a flattened PBzT cylinder by a controlled amount in two orthogonal directions, thereby producing a film with additional biaxial orientation.

The next required processing step is the coagulation of the oriented film by spraying it with water to lock in the orientation and then the placement of the film in a water bath to remove the acid solvent by diffusion. The water-swollen oriented PBzT film is then dried.

EXAMPLE 2

Using the Perkin-Elmer TMS-2 instrument, samples of PBzT film produced as in Example 1 were tested for CTE. One sample was made with only a small biaxial orientation. As expected, the CTE along the machine direction was negative—while it is positive in the transverse direction. Machine direction values of CTE ranged from −0.7 ppm/° K. near 100° K. to 10 ppm/° K. The transverse direction showed hysteresis effects with generally a positive CTE of higher absolute values than in this machine direction.

As illustrated in Table II, PBzT film can have a variety of CTE values, depending upon the treatment during processing. At low orientation angles, PBzT film shows a negative CTE in the machine direction and positive CTE in the transverse direction. From ±11 to ±19 deg., the transverse CTE goes from positive to negative. For ±43 deg. the measured CTE is negative in both the machine and transverse directions.

TABLE II

| | | CTE SUMMARY | | |
|---|---|---|---|---|
| DESCRIPTION | ppm/°C. | DIRECTION | TEMP. RANGE, °C. | COMMENTS |
| ±11°, Tube Die | −14, +4 | MD, TD | −170 to 100 | |
| ±19°, Tube Die | −10, −8 | MD, TD | −170 to 0 | |
| ±25°, Tube Die | −24, −24; 4.3 | MD, TD | −150 to 150 | |
| ±43°, Tube Die | −7, −5 | MD, TD | −170 to 0 | |
| ±45°, Tube Die | +2, −10 | MD, TD | −50 to 150 | |
| ±45°, Tube Die | −3, −9, −17 | MD, TD, 45° | −150 to 150 | |
| Tube Die | −5, +9 | MD, TD | −150 to 150 | Sample rolled into tubes, Compression Probe Test |
| Compression Die | 8, 12, 3; 14, 16 | RD; AZ | −170 to 0 | From green roller die; no rotation |
| Compression Die | 7, 20, 10; | RD; AZ | −150 to 150 | From green roller die; rotation; see X-Ray |
| Compression Die | 3.30; −1, −5 | RD, AZ | −150 to 0 | From green roller die; high rotation |
| Compression Die | 29, 30; −15, −15 | RD, AZ | −150 to 0 | Extruded into die; high rotation |
| Compression Die | −6, −11; −22, | RD, AZ | −160 to 150 | Incomplete acid washout |

TABLE II-continued

| | | CTE SUMMARY | | |
|---|---|---|---|---|
| DESCRIPTION | ppm/°C. | DIRECTION | TEMP. RANGE, °C. | COMMENTS |
| | −14; 15.2 | | | |

Key:
MD = machine direction
TD = transverse to machine direction
RD = radial direction
AZ = azimuthal direction
1,2,3 is an orthogonal direction set 45° in plane to MD, AZ, 1, etc.

EXAMPLE 3

The best structural components were made by infiltration of the PBzT film with IP600 polyimide (Nat. Starch) and lamination with the high temperature polymer PEEK (ICI Ltd.). IP600 was used because it is a low viscosity solution before curing so that it rapidly impregnates the wet PBzT film. Also, IP600 is a high temperature (300° C.) and low outgassing polymer.

PEEK resin was used as an adhesive because of its high temperature resistance, low outgassing characteristics, good chemical and environmental resistance and compatibility with PBzT and polyimide processing conditions. In addition, PEEK has a relatively low modulus of $7 \times 10^3$ mPa and high CTE of $+30 \times 10^{-6}$ °C.$^{-1}$. CTE values of 1 to 3 ppm °C.$^{-1}$ were achieved.

In addition, the values were linear throughout the temperature range from −170° to 75° C. Mechanical tests, reported below, confirmed the good performance of the materials and directed the future steps necessary to achieve a truly low ($10^{-8}$ °C.$^{-1}$) CTE polymer-based system.

Table III compares the CTE values of several PBzT/Epoxy laminates. The numerical CTE values are based upon experimental CTE measurements and the units, ppm/° C., are omitted for brevity.

EXAMPLE 4

PBzT structural composites were mechanically tested to compare their engineering properties to those of other structural materials and to determine the effects of infiltrating a low molecular weight thermosetting polyimide in the film prior to lamination. The uninfiltrated laminates were approximately 50 percent PBzT and 50 percent PEEK by volume. The infiltrated laminates contained approximately equal volume fractions of PEEK, PBzT and IP600. All laminates tested were in a quasi-isotropic layup.

Initial observations on the highly oriented PBzT materials showed low intralaminar strength as evidenced by the ability to delaminate a film layer by applying a pressure sensitive tape to the surface of the film and peeling normal to the surface. The peeling force was sufficient to remove fibrils from the film.

The process of infiltration of a thermosetting polyimide was used to eliminate the inherent weakness of low intralaminar strength. The data generated from the mechanical tests of short beam shear, tensile, and flexure showed much improvement in material properties with infiltration and the necessity to lock in the continuous rigid rods with another material to form a structural substrate.

TABLE III

| | COEFFICIENT OF THERMAL EXPANSION FOR LAMINATED PBzT MATERIALS | | | | |
|---|---|---|---|---|---|
| MATERIAL | MACHINE DIRECTION[1] | TRANSVERSE DIRECTION[2] | 45° DIRECTION | TEMPERATURE RANGE °C. | COMMENTS |
| PBzT/EPOXY | −10 | −10 | −6 | −170 to 0 | Angle Ply |
| PBzT/EPOXY | −13 | +4 | −6 | −170 to 0 | Balanced Symmetric |
| PBzT/EPOXY | −10 | −7 | −8 | −170 to 0 | Quasi Isotropic |
| PBzT/EPOXY | −15 | +2 | — | −170 to 0 | Angle Ply |
| PBzT/POLYIMIDE | −10 | +3 | — | −100 to 0 | Angle Ply |
| Lam. PBzt/E 50% v/v | 0, 0.11; 14; | — | — | −160 to 150 | Axial Film |
| Lam. PBzT/E | 12; −14, −6 | — | — | −170 to 150 | ±45° Film (±45/0/90/Ni)s |
| Lam. PBzT/E/N | 5.2; 2 | — | — | −170 to 150 | 6 PBzT: 1Ni, Vol:Vol (o/90/±45)s |

The angle ply laminate was layed up from ±45 deg. film to have molecules equally oriented in the 1 and 2 directions. CTE in the 1 and 2 directions are equal (−10). The added epoxy affected the base CTE value by raising it from −15 to −10. Similarly, the CTE at 45 deg. was driven to −6 from a value of about −10. The balanced symmetric PBzT/Epoxy laminate made from high draw (±11°) film shows different behavior from the quasi-isotropic layup.

The specimen with less PEEK (and more PBzT) has a low CTE of +1 to +3 in the plane. This sample was not successfully isotropic but did give the lowest CTE values yet reported. The sample made with thick PEEK film was highly isotropic. Engineering calculations were used to estimate the most desirable volume fractions for a zero CTE laminate of this type, which yield; PBzT: 52 percent; polyimide: 38 percent; and PEEK: 10 percent.

EXAMPLE 5

The addition of nickel cladding was investigated and found to alter the overall CTE. The quasi-isotropic specimen was made like the previously described laminated specimens, with the exception that nickel foil was laminated to the surface with epoxy. The final specimen contained 20 percent nickel.

CTE measurements showed positive average CTE values in the machine and transverse directions with values of 5 and 2, respectively. The anisotropy is most likely due to slightly unbalanced or unsymmetric film plies. Nickel foil has a CTE of +13 and a modulus of $30 \times 10^6$ psi. The high modulus and positive CTE of nickel is responsible for the large increase in CTE of the laminate.

TABLE IV

| Description | ppm/°C. | Direction | Temperature Range, °C. |
|---|---|---|---|
| PBzT structural composites/ Ni Foil | 5; 2 | MD; TD | −170 to 150 |

EXAMPLE 6

Bonded honeycomb sandwich construction has been a structural concept in the aerospace industry for over thirty years. The resulting high stiffness with low weight is ideal for large space-based structures. This interest culminated in the fabrication of PBzT structural composite stiffened honeycomb panel having a low (less than $10^{-6}$ °C.$^{-1}$) CTE.

Biaxially oriented PBzT film with ±45 deg. orientation angles was laminated into two-, four- and eight-ply quasi-isotropic layups. Epoxy was used as the adhesive. The face sheets were subsequently bonded to $\frac{1}{8}$-in. cell size Nomex honeycomb from Ciba-Geigy in a laboratory press. The adhesive used was American-Cyanamid's FM123-2 which is a film adhesive designed for honeycomb core bonding applications. Lamination pressures were 85 psi.

The panel resulting from lamination of two plies of PBzT to the core showed good adhesion. Four-ply construction was also demonstrated. Eight-ply construction was successful in forming a panel with a smooth surface.

The present invention has been described in detail, including the preferred embodiments thereof. However, it will be appreciated that those skilled in the art, upon consideration of the present disclosure, may make modifications and improvements on this invention and still be within the scope and spirit of this invention as set forth in the following claims.

What is claimed is:

1. An article of manufacture comprising a thin, dimensionally stable, high stiffness near zero CTE film based component, comprising a molecularly oriented lyotropic liquid crystalline film.

2. The article of claim 1, which further comprises a sandwich composite of one or more lyotropic liquid crystalline films and a secondary reinforcing material, the secondary reinforcing material comprising a low viscosity polymer solution which is capable of rapidly impregnating the molecularly oriented lyotropic liquid crystalline film.

3. The article of claim 1 or 2, wherein the film has a thickness of from about 0.001 to 0.050 in.

4. The article of claim 1 or 2, wherein the film has a specific stiffness of over about $10^8$ in.

5. The article of claim 1 or 2, wherein the film has tailorable properties including strength, stiffness, toughness, and thermal conductivity.

6. The article of claim 1 or 2, wherein the coefficient of thermal expansion is about $2 \times 10^{-6}$ °C.$^{-1}$ to $-2 \times 10^{-6}$ °C.$^{-1}$.

7. The article of claim 1 or 2, wherein the coefficient of thermal expansions is about $1 \times 10^{-6}$ °$^{-1}$ to $-1 \times 10^{-6}$ °C.$^{-1}$.

8. The article of claim 1 or 2, wherein the film has high impact resistance and fracture toughness at low temperatures.

9. The article of claim 8, wherein the low temperature fracture toughness and impact resistance includes temperatures below about −170° C.

10. The article of claim 8, wherein the film will survive contact with liquid hydrogen fuels.

11. The article of claim 10, wherein the low temperature strength includes temperatures below about 20° K.

12. An article of manufacture comprising a thin, dimensionally stable, high stiffness, film based component, comprising a molecularly oriented lyotropic liquid crystalline film, said article having a CTE of from about −3 to $-5 \times 10^{-6}$ °C.$^{-1}$.

13. The article of claim 2, wherein the secondary reinforcing material comprises a low-molecular weight thermosetting polyimide.

14. The article of claim 13, wherein the polyimide is IP600.

* * * * *